United States Patent
Okamoto et al.

(10) Patent No.: US 7,480,992 B2
(45) Date of Patent: Jan. 27, 2009

(54) COOLING PLATE AND MANUFACTURING METHOD THEREOF, AND SPUTTERING TARGET AND MANUFACTURING METHOD THEREOF

(75) Inventors: Kazutaka Okamoto, Hitachi (JP); Masayuki Doi, Hitachinaka (JP); Hisanori Okamura, Tokai (JP); Yasuhisa Aono, Hitachi (JP); Manabu Kagawa, Ishioka (JP); Satoshi Hirano, Hitachi (JP); Kinya Aota, Hitachi (JP)

(73) Assignees: Hitachi, Ltd., Tokyo (JP); HItachi Cable, Ltd., Tokyo (JP)

( * ) Notice: Subject to any disclaimer, the term of this patent is extended or adjusted under 35 U.S.C. 154(b) by 0 days.

(21) Appl. No.: 11/693,431

(22) Filed: Mar. 29, 2007

(65) Prior Publication Data
US 2007/0163120 A1 Jul. 19, 2007

Related U.S. Application Data

(60) Division of application No. 11/302,117, filed on Dec. 14, 2005, which is a continuation of application No. 10/828,234, filed on Apr. 21, 2004, now abandoned, which is a continuation of application No. 10/024,598, filed on Dec. 21, 2001, now abandoned.

(30) Foreign Application Priority Data

Dec. 22, 2000 (JP) .............................. 2000-390165
May 23, 2001 (JP) .............................. 2001-153962

(51) Int. Cl.
*B21D 21/00* (2006.01)
*B21D 39/00* (2006.01)
*B23K 20/12* (2006.01)
*B23K 31/00* (2006.01)
*B23K 31/02* (2006.01)
*B23P 6/00* (2006.01)
*F28F 1/00* (2006.01)
*F28F 3/14* (2006.01)

(52) U.S. Cl. .............................. 29/890.054; 29/890.032; 29/890.053; 165/170; 165/177; 228/169; 228/165; 228/114.5; 228/112.1; 228/2.1

(58) Field of Classification Search ............. 29/890.054, 29/890.053, 890.032; 165/170, 177; 228/169, 228/165, 112.1, 114.5, 2.1
See application file for complete search history.

(56) References Cited

U.S. PATENT DOCUMENTS

| 1,954,638 | A | * | 4/1934 | Loeffler ................. 29/890.053 |
| 3,971,435 | A | * | 7/1976 | Peck ......................... 165/80.4 |
| 5,460,317 | A | * | 10/1995 | Thomas et al. ........... 228/112.1 |
| 5,697,428 | A | * | 12/1997 | Akachi ................... 165/104.21 |
| 5,960,866 | A | * | 10/1999 | Kimura et al. ............. 165/80.3 |
| 6,058,010 | A | | 5/2000 | Schmidt et al. |
| 6,129,145 | A | * | 10/2000 | Yamamoto et al. ......... 165/168 |
| 6,133,631 | A | | 10/2000 | Belady |
| 6,302,192 | B1 | | 10/2001 | Dussinger et al. |
| 6,344,117 | B2 | * | 2/2002 | Enomoto et al. ....... 204/298.09 |
| 6,379,466 | B1 | | 4/2002 | Sahin et al. |
| 6,457,629 | B1 | * | 10/2002 | White ..................... 228/112.1 |
| 6,516,992 | B1 | | 2/2003 | Colligan |
| 6,637,109 | B2 | * | 10/2003 | Nyqvist ................... 29/890.03 |
| 6,722,555 | B2 | * | 4/2004 | Ezumi et al. ............. 228/112.1 |
| 6,966,481 | B2 | * | 11/2005 | Aota et al. ............... 228/112.1 |
| 2001/0017763 | A1 | | 8/2001 | Kaufmann |
| 2001/0047935 | A1 | | 12/2001 | Emomoto et al. |
| 2002/0125299 | A1 | * | 9/2002 | Ezumi et al. ............. 228/112.1 |
| 2003/0022008 | A1 | * | 1/2003 | Jogan et al. .............. 428/472.2 |

FOREIGN PATENT DOCUMENTS

| JP | 4-184094 A | 7/1992 |
| JP | 7-505090 | 6/1995 |
| JP | 8-264694 A | 10/1996 |
| JP | 9-309164 | 12/1997 |
| JP | 10-52770 | 2/1998 |
| JP | 10-216964 | 8/1998 |
| JP | 11-197855 | 7/1999 |
| JP | 2000-73164 | 3/2000 |
| JP | 2000-73164 A | 3/2000 |
| JP | 2000-94156 | 4/2000 |
| JP | 2000-246467 A | 9/2000 |
| JP | 2001-223310 A | 8/2001 |

OTHER PUBLICATIONS 2 sheets of Form PTO-119 and 3 sheets of Form PTO-892.
Japanese Office Action dated Jan. 6, 2007.

* cited by examiner

*Primary Examiner*—David P Bryant
*Assistant Examiner*—Alexander P Taousakis
(74) *Attorney, Agent, or Firm*—Crowell & Moring LLP

(57) ABSTRACT

The present invention is a cooling plate including a groove, which becomes a passage of a coolant, inside a body, wherein one or more fins are provided inside the groove, wherein the groove is covered with a lid having width larger than the groove, wherein the lid is joined to the body by friction stir welding, and wherein a weld bead formed by: the joining is outside the passage, and the weld bead formed by the joining is formed within the body and further, is characterized by a manufacturing method of a cooling plate that has a first groove, which becomes a passage of a coolant, and a second groove, which has width larger than the first groove and receives a lid on the first groove, inside a body, receives the lid on the second groove, and is joined to the body, the manufacturing method of a cooling plate wherein, while the lid and the body are joined together by the friction stir welding owing to insertion of a-rotation tool having a shoulder and a pin, the joining is performed so that a weld bead formed by the joining may become out of the passage, and furthermore, is characterized in that a target for sputtering is joined to the cooling plate.

9 Claims, 7 Drawing Sheets

2mm

COOLING PLATE AND MANUFACTURING METHOD THEREOF, AND SPUTTERING TARGET AND MANUFACTURING METHOD THEREOF

This application is a divisional of prior U.S. patent application Ser. No. 11/302,117, filed Dec. 14, 2005, the entire disclosure of which is incorporated herein by reference, which is a continuation of prior U.S. patent application Ser. No. 10/828,234, filed Apr. 21, 2004, abandoned, which is a continuation of prior U.S. patent application Ser. No. 10/024,598, filed Dec. 21, 2001, abandoned, which claims priority under 35 U.S.C. § 119 to prior Japanese applications 2000-390165, filed Dec. 22, 2000, and 2001-153962, filed May 23, 2001.

BACKGROUND OF THE INVENTION

The present invention relates to a new cooling plate and a manufacturing method thereof, a sputtering target and a manufacturing method thereof, a backing plate and a manufacturing method thereof, and a sputtering target and a manufacturing method thereof.

PRIOR ART

Although a cooling plate is widely used industrially, an efficient cooling function is required. For example, in a sputtering apparatus, efficient radiation of the heat generated in a target material affects the performance of a thin film that is obtained. In particular, in the case of a sputtering apparatus for a liquid crystal manufacturing apparatus, a target material with a large area is used, which radiates plenty of heat. For this reason, a backing plate is used as a cooling plate, the backing plate having a channel inside a smooth plate composed of copper, a copper alloy, aluminum, or an aluminum alloy, and having the structure that the channel is covered with a lid and the lid and cooling plate are metallically joined to be sealed. Up to now, the joining of a body of a backing plate and a lid is performed by metallically joining them by electron beam welding, diffusion bonding, a brazing method, etc. In addition, besides the backing plate, various kinds of water cooled jackets, water-cooled chills, etc. are used as a heat sink, and every one has the structure of having a channel therein similarly to the above-described backing plate.

Moreover, it is necessary for a backing plate used for a liquid crystal manufacturing apparatus to support a target material at a sputtering step, and to have an efficient cooling function. For this reason, the backing plate has a channel inside a smooth plate composed of copper, a copper alloy, aluminum, or an aluminum alloy, and has the structure that the channel is covered with a lid and the lid and cooling plate are metallically joined to be sealed up to now, the joining of a body of a backing plate and a lid is performed by metallically joining them by electron beam welding, diffusion bonding, a brazing method, etc.

In regard to the manufacture of this backing plate, there is JP-A-2000-73164 specification, where a backing plate is shown, where a plate-like cooling section that has a coolant passage inside is integrated with a plate-like base section by friction stir welding.

Since a backing plate needs to enhance cooling effectiveness, good flatness and smoothness are required of a surface of the backing plate that contacts with a target material etc. Up to now, the joining of a body of a backing plate and a lid covering a channel is performed by electron beam welding, laser welding, diffusion bonding, a brazing method, etc.

However, since it is necessary to make a surface flat by correction or machining after joining because these welding methods have large heat distortion after joining, they have problems in respect of quality, and accuracy, and further productivity and cost.

Furthermore, in the above-described known example, although the structure that a target is provided through a plate-like base section provided on a plate-like cooling section which has a coolant passage is shown, not only direct cooling cannot be obtained, but also the formation of a compact cooling passage cannot be obtained.

SUMMARY OF THE INVENTION

An object of the present invention is to provide a cooling plate, which has high cooling effectiveness and a thin, large area, and a manufacturing method thereof, and a sputtering target and a manufacturing method thereof.

The present invention is a cooling plate characterized in that a groove, which becomes a passage of a coolant, is provided inside a body, that this groove is covered with a lid with width larger than the groove, that the lid is joined to the body by friction stir welding, and that a weld bead formed by the welding is outside the passage.

Furthermore, the present invention is a cooling plate characterized in that grooves, which become passages of several independent coolants, are provided inside a body, that the groove is covered with a lid, that the lid is joined to the body by friction stir welding, and that a weld bead formed by the joining is outside the passage.

Moreover, the present invention is a cooling plate characterized in having any one or combination of the structure that a groove, which becomes a passage of a coolant, is provided inside a body, the groove is covered with a lid, the lid is joined to the body by friction stir welding, and at least an end of a weld bead formed by the joining is formed in the body except a joining, the structure that a groove, which becomes a passage of a coolant, is provided inside a body, the groove is covered with a lid with width larger than the groove, the lid has one or more fins, the groove is covered with a lid with width larger than the groove, the lid is joined to the body by friction stir welding, and a weld bead formed by the joining is outside the passage, and the structure that the passage is a passage closed within the body, an air vent is provided in a portion forming the passage, and at least an end portion of the weld bead of the joining is formed except the joining.

In particular, since the present invention performs joining with fitting a lid, which covers a groove, into the groove to a body where the groove with a path as a closed channel is formed, there is no mutual expansion of matching sections. Hence, not only good joining can be obtained, but also there is no excessive joining because the body itself is in one piece, and hence it is possible to obtain a cooling plate with a compact thin shape is obtained also in a large area regardless of an area.

The channel is at least one of an I-shaped channel, a U-shaped channel, an S-shaped channel, and an M-shaped channel, a round channel, and a spiral channel, and it is preferable that one or more of them are used. Since each channel has a closed path, an entrance and an exit are located in each path. Hence, each entrance and each exit are connected in parallel in two or more channels, and hence, uniform cooling can be performed as the whole cooling plate. It is preferable to join the channels so that more uniform cooling may be performed.

Although it is preferable that the body and lid are composed of copper, a copper alloy, aluminum, an aluminum alloy, titanium, or stainless steel, the former having higher heat conduction is more preferable.

The present invention is a manufacturing method of a cooling plate that has a first groove, which becomes a passage of a coolant, and a second groove, which has width larger than the first groove and receives a lid on the first groove, inside a body, places the lid on the second groove, and is joined to the body, the manufacturing method of a cooling plate being characterized in that, while the lid and the body are joined together by friction stir welding owing to the insertion of a rotation tool having a shoulder and a pin, the joining is performed so that a weld bead formed by the joining may become outside the passage. The above-described joining method can perform joining at a temperature of a fusing point of copper or aluminum or lower. Furthermore, the above-described joining performs joining in a coolant such as water, oil, or an inert gas, or with compulsorily cooling the lid and body by pouring the above-described coolant near the joining.

A friction stir welding method according to the present invention is a method of performing joining with using frictional heat and plastic flow which are generated between the rotation tool and joining material by rotating and inserting a rotation tool which has a shoulder and a pin that are made of material harder than the aluminum or a copper alloy substantially and relatively moving the joined material. This is disclosed by National Publication of the Translated Version of PCT Application No. 7-505090 specification, etc. That is, since a plastic flow phenomenon by the frictional heat between the rotation tool and joined material is used, this is different from conventional welding such as electric arc welding and electron beam welding, but does not perform joining (welding) with melting the joined material. Furthermore, the friction stir welding method differs from a method of rotating workpiece like a conventional friction welding method performing joining with frictional heat, but is a method of being able to continuously join a workpiece in the longitudinal direction of a joining line below a fusing point of the joining material.

By using the friction stir welding method, since it is possible to perform joining at a low temperature below the fusing point of a joining material, distortion by the joining is small in comparison with a conventional welding method, and hence a cooling plate with high accuracy can be manufactured. Hence, it is possible to simplify the correction step after joining, and to reduce cost by shortening correction work-hours.

Furthermore, this joining method can perform joining in a coolant such as water, oil, or an inert gas, or with pouring the above-described coolant near the joining. At this time, since it is possible to suppress temperature rise in a position apart by several mm from the joining, it is possible to suppress heat distortion after joining to the minimum. Hence, it is possible to make a face, which contacts to the silicon wafer, smooth and accurate, and therefore, to manufacture a reliable backing plate.

Namely, the present invention is a manufacturing method of a backing plate that is made of copper, a copper alloy, aluminum, or an aluminum alloy, is composed of a body and a lid, and has a cooling channel that is covered with the lid, and in which the lid is metallically joined to the body, the manufacturing method of a backing plate being characterized in that the lid and body are joined by friction stir welding.

When the rotation tool that is composed of the shoulder and pin that are used for friction stir welding rotates counterclockwise, it is preferable that the channel is in the left-hand side to the traveling direction of the rotation tool. Moreover, when the rotation tool rotates clockwise, it is preferable that the channel is in the right-hand side. When the rotation tool rotates counterclockwise, a minute defect may arise in the right-hand side to the traveling direction of the rotation tool rarely. When the channel is located in the right-hand side at this time, a defect will arise near a wall surface of the channel. However, when the channel is located in the left-hand side, a defect will arise inside the body and will not arise near the channel. Of course, what is necessary is just to consider this conversely, when the rotation tool rotates clockwise.

Moreover, the center of the rotation tool which is composed of the shoulder and pin which are used for friction stir welding may be in a position apart from the channel by more than the maximum radius of a pin section. Thus, in the friction stir welding, a workpiece receives a downward load of about 10 kN from the rotation tool. If the rotation tool is on the lid above the channel, copper etc. will be deformed and collapsed due to this load, and a part of a wall will escape into the channel so that the joining will not be successful. In addition, in general, the geometry of a channel is about 50 W×5 D mm, and the thickness of a lid is about 5 mm.

The lid covering the channel for cooling is larger than the channel, and is made in socket-and-spigot structure with the body. The lid is produced by machining, where curves with about R 3 to R 10 (unit: mm) are provided in corner sections in order to make it easy to insert the lid into the body. When the lid is joined to the body by the friction stir welding, it is necessary to perform such curved joining. As described above, when the rotation tool rotates counterclockwise, a defect may arise in the right-hand side to the traveling direction of the rotation tool rarely. Namely, when passing the curves, it is necessary to relatively lessen a right-hand joining region in order to eliminate a defect in the right-hand side of the rotation tool. Hence, when the rotation tool passes a planar curve (R section), its curving direction may be opposite to the rotary direction of the rotation tool.

Generally, in the friction stir welding, joining is performed with slightly leaning a rotation tool backward to the traveling direction. Since the joining of a backing plate is the joining of two-dimensional planar surfaces, it is necessary to control a sweepback angle of the rotation tool so that the sweepback angle may always become constant to a joining direction. For this reason, it is necessary to have one control axis for it in a joining apparatus. However, according to the present invention, a rotation tool does not necessarily need to have a sweepback angle. Namely, even if the rotation tool is always perpendicular to a joining material, good-quality joining is possible, and hence, the simplification of the apparatus can be attained. In addition, even if a sweepback angle is given to the rotation tool, it is also possible to join a joining, which becomes a straight line and a curve, only in a straight line. That is, it is also possible to use a method of joining a planar curve (R section), which becomes a folding from a straight section, in a form composed of two straight lines.

Moreover, in the friction stir welding, since the rotation tool that is rotating forcibly moves against a workpiece, so to speak, the workpiece receives a large force from the rotation tool. For this reason, it is necessary to fix a work firmly. In the case of a backing plate, depending on its geometry, it is comparatively easy to fix the body. However, it is comparatively difficult to fix the lid because the channel winds and has the complicated geometry. Then, it is necessary to temporarily tack-weld the lid to the body beforehand. Unlike permanent joining, temporary attachment has narrow joining sections and heat input is not large, and hence, a conventional welding method is also sufficient. However, it is preferable to perform the friction stir welding. This is because cost increase due to a plurality of processes. Thus, first, the rotation tool composed of only a shoulder is inserted into a joining with being rotated. It is necessary to make the amount of insertion at this time smaller than the amount of shoulder insertion at the time of performing permanent joining after this.

Then, the rotation tool is drawn out and this is given to several points. Thereby, as for the joining, only surface sections are joined. After the temporary attachment, the rotation tool is exchanged and permanent joining is performed.

The present invention is a manufacturing method of a cooling plate which has a groove, which becomes a passage of a coolant, inside a body, and in which a lid is joined to the groove, the manufacturing method of a cooling plate characterized in that a joining of the body and the lid has a projection thicker than other sections, and joining to the projection is performed by friction stir welding owing to insertion and movement of a rotation tool having a shoulder and a pin, that, while the lid and the body are joined by the friction stir welding, and an air vent is provided in a portion forming the passage, that, while the lid and body are joined by the friction stir welding owing to the insertion and movement of the rotation tool having a shoulder and a pin, and at least an end section of the joining is formed except the joining, and that, after the lid and body are partially and temporarily joined by the friction stir welding owing to insertion of the rotation tool which has only a shoulder, and a whole joining is joined by the friction stir welding.

A projection formed more thickly than other sections in the joining of the body and lid is used for preventing cutting in a plane section at the time of cutting after joining by making the depression depth of this concavity into the thickness higher than the plane section since the concavity is formed in a joining by the insertion of the rotation tool which has the shoulder and pin at the time of joining.

An air vent is provided in a section, where a passage is formed, because normal joining can be performed by releasing air in the groove to the outside at the time of installing the lid in the groove at the time of joining, and at the time of performing joining by the insertion of the rotation tool. Since a groove according to the present invention forms a channel closed inside a body of a cooling plate, it is preferable to use a lid having the same planar surface geometry as the groove. Therefore, they coincide with each other exactly. Hence, the air vent is required.

In an end section of a joining, an insertion hole for a rotation tool is formed. Hence normal joining can be performed by leading the end section to the inside of a cooling plate body except the joining, and forming the insertion hole for the rotation tool in the section.

In conventional electron beam welding or the like, since the deformation of a joining material after joining is large, the front and back faces of a backing plate are ground after correcting a warp after joining. When joining by the friction stir welding is used, since the deformation after joining can be suppressed, the number of steps can be reduced as described above, and cost reduction is possible. However, since a joining to be joined by the friction stir welding is joined with a rotation tool being inserted in the joining, a burr arises near the joining, and hence a wall of the joining is made to be thin in comparison with those of other sections. Since the surface smoothness is not perfect without processing after the joining, surface grinding is needed in any case. If the joining of the body and lid is partially thick, it is possible to make the thickness of the joining after the joining be almost equivalent to that of other sections. Hence, it becomes possible to decrease surface cutting cost after the joining, and therefore, it leads to the reduction of manufacturing cost.

The friction stir welding performs solid state welding by pressing a rotation tool against a joining, using frictional heat generated in the rotation tool and the joining, pushing the rotation tool into the joining, and stirring materials through moving the rotation tool and generating a plastic flow. What becomes a problem here is that a resistance force generated when inserting or moving the rotation tool to the joining is about 10 kN or more. For this reason, the structure of the joining material that bears this force, and the restraint of the joining material itself are needed. In the case of a backing plate, depending on its geometry, it is comparatively easy to fix the body. However, it is comparatively difficult to fix the lid because the channel winds and has the complicated geometry.

Then, it is necessary to temporarily attach the lid to the body beforehand. Unlike permanent joining, temporary attachment has narrow joining sections and heat input is not large, and hence, a conventional welding method is also sufficient. However, it is preferable to perform the friction stir welding. This is because cost increase due to a plurality of processes. That is, first, the rotation tool composed of only a shoulder is inserted into a joining with being rotated by previously performing the friction stir welding on the body and the lid. It is necessary to make the amount of insertion at this time smaller than the amount of shoulder insertion at the time of performing permanent joining after this.

Then, the rotation tool is drawn out and this is given to several points. Thereby, as for the joining, only surface sections are joined. After the temporary attachment, the rotation tool is exchanged and permanent joining is performed. In addition, by performing joining of only a curve by conventional welding in the joining of the body and lid of the backing plate, a section where the friction stir welding is performed becomes only a straight section owing to this, the axial structure of a friction stir welding apparatus is simplified, and hence, the reduction of apparatus cost is possible.

Furthermore, as for the friction stir welding, a starting point and an ending point of joining are different from those in other stationary states in regard to a heat input and geometry. Since the rotation tool is forcibly inserted in the joining at the starting point, a resistance force that the rotation tool receives is large, and the heat input also becomes large. It is one of measures to pierce a hole a little smaller than the pin in an insertion section of the rotation tool in order to reduce the resistance force at the starting point. In addition, the hole with the volume equivalent to the pin is pierced at the ending point, as described above. Hence, these problems are solvable by making the starting point or the ending point of the joining in the body, which is apart from the cooling hole, or a dummy section prepared separately.

There are various dimensions of backing plates according as applications. As an example, a backing plate for a sputtering system for large-sized flat panel liquid crystal displays has an area of 1 $m^2$ or more. In this case, it is preferable to provide four to five cooling holes each approximately having 50 W×5 H mm in a zigzag direction. Thus, in a large-sized backing plate, since the length of a joining is long, it is desirable to perform joining with a plurality of rotation tools simultaneous or with providing a fixed distance between a plurality of rotation tools in a proceeding direction of the joining, rather than one position joining at a time with one rotation tool. In addition, since the axial structure for controlling each rotation tool is simplified by performing joining through the plurality of rotation tools moving in the directions that cross mutually, cost reduction of the joining apparatus can be attained. Either face of a target can be placed to a cooling plate since it is possible to correct press forming of deformation after manufacturing, and subsequently, to finish the target smoothly by grinding and polishing, but the target may be placed in the side opposite to a joining face.

Up to now, products manufactured with using the friction stir welding are, for example, railroad vehicles, vessels, rocket fuel tanks, etc. All of these products are made of aluminum. Although backing plates are made of aluminum or copper, copper alloys become the main stream because of excellent heat conductivity in view of thermal efficiency. Hence, in the case of copper, both a melting point and a strength are higher as compared with aluminum, when the friction stir welding is performed, it is necessary to increase temperature of a stirring section to about 700° C. Incidentally, in the case of aluminum, since a fusing point is low and strength is also low, the temperature is sufficient at only about 450° C.

At the time of manufacturing a copper backing plate by the friction stir welding, several troubles arise since joining temperature becomes high as described above. These are troubles caused by the material being copper. First, what is an issue is that a motor and a spindle that rotate a rotation tool also become hot due to heat transfer since the temperature of the rotation tool itself also becomes hot because of high joining temperature. Although there is also exhaustion of the rotation tool itself, exhaustion of an apparatus is rather an issue. In order to perform joining completely, it is not possible to decrease the temperature of the joining. Therefore, it is necessary to perform joining with spraying a coolant to the rotation tool, which is rotating, in order not to make the frictional heat of the rotation tool and joining transferred to the apparatus owing to this, the heat transfer to the spindle is remarkably suppressed, and hence, the long life of the apparatus can be achieved.

In addition, in the case of a large backing plate, joining length becomes long and a heating value also becomes large. At this time, heat is also transferred to a table supporting the backing plate, and hence, the exhaustion of a lubricant of a section driving a table, and in particular, a circumference moving section becomes an issue. Then, in order to suppress the heat transfer to the apparatus side such as a table, it is desirable to perform joining with placing the backing plate on a heat sink different from this. Furthermore, in consideration of the above-mentioned rotation tool life, it is desirable to join the lid, covering one channel, and the body with one rotation tool without performing joining in a long distance with one rotation tool and to perform the next joining after exchanging the rotation tool. Owing to this, the rotation tool first used is sufficiently cooled while performing joining with another rotation tool, and hence, the extension of the rotation tool life is achieved.

In addition, in the friction stir welding, a burr arises near a joining as described above. After all of joining is completed, it is possible to exchange the rotation tool for joining to the rotation tool for cutting and to remove the burr generated in the joining. It is better to perform the exchange of these rotation tools automatically by providing a rotation tool magazine and constructing a sequence, rather than manual exchange since the rotation tool has high temperature.

Thus, it becomes possible to manufacture a backing plate, which has small heat distortion after joining and has good quality, by producing the backing plate for sputtering as a cooling plate with using friction stir welding.

The present invention is a manufacturing method of a cooling plate where a target material for sputtering is joined on a backing plate serving as a cooling plate, the manufacturing method of a cooling plate characterized in that the cooling plate is manufactured with the manufacturing method of a cooling plate that is described above.

PREFERRED EMBODIMENTS OF THE INVENTION

Embodiment 1

Figure 1:
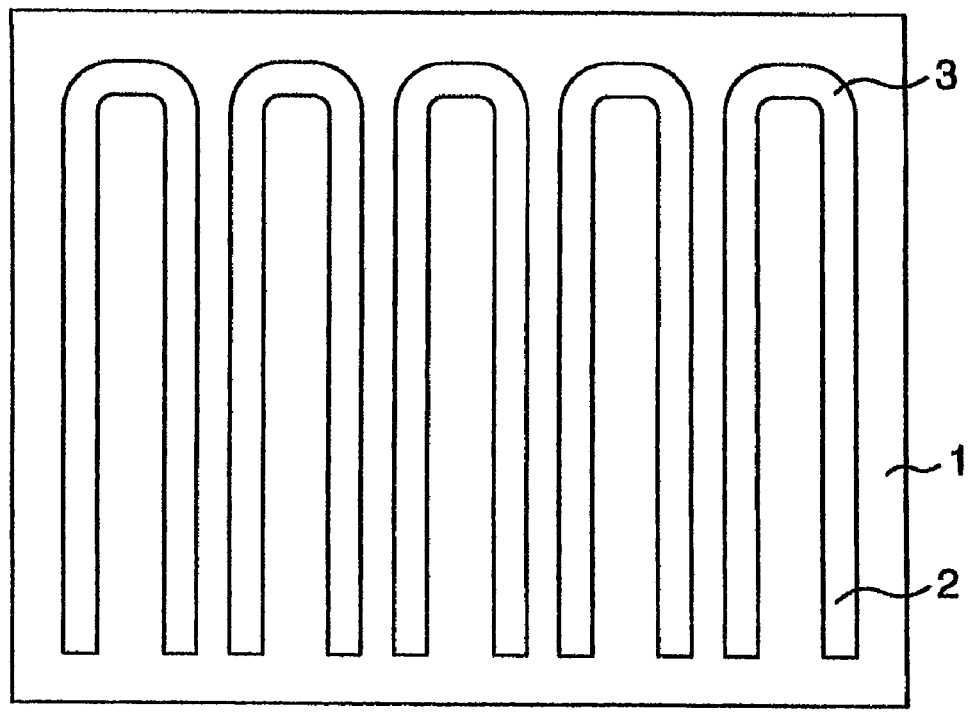
FIG. 1 is a plan of a backing plate according to the present invention.

FIG. 1 is a schematic front view of a backing plate as a cooling plate made of oxygen free copper or a copper alloy containing 5% or less of Zr or Cr. The backing plate consists of a body 1 and a lid 2. A U-channel 4 is provided in the body 1, the lid 2 covers the channel 4, and, the lid 2 and channel 4 have the same plane and zigzag geometry although the lid 2 and channel 4 differ from each other in dimensions of U-shapes. Otherwise, I-shaped and S-shaped channels or the like are preferable. In addition, an R section 3 is provided in each corner section of the lid 2 in order to make the lid 2 easily inserted in the body 1. The lid 2 has the structure of being received with a step of the body 1, and can receive the force of the rotation tool 6 on the occasion of the friction stir welding.

The dimensions of the body 1 are 1500 L×1200 W×15 D mm. In the case of this FIG. 1, there are five channels 4 for cooling. If the dimensions are 1300 L×900 W×15 D mm, similarly, four U-channels 4 are provided. In this embodiment, there are three channels 4 per one meter long. Each channel 4 has an independent closed path, and an entrance and an exit for a coolant are provided in both ends of each channel 4 respectively, and are used after joining. I-shape and S-shape channels are the same as the U-shape channel. An air vent is provided in an end section of the lid 2 (not shown). The installation and joining of the lid 2 become easy by providing the air vent.

In particular, in this embodiment, since joining is performed with fitting the lid 2, which covers the groove, into the groove to the body 1 where the groove with a path as a closed channel 4 is formed, there is no mutual expansion of matching sections. Hence, not only good joining can be obtained, but also there is no excessive joining because the body 1 itself is in one piece, and hence it is possible to obtain a cooling plate with a compact thin shape is obtained also in a large area regardless of an area.

Figure 2:
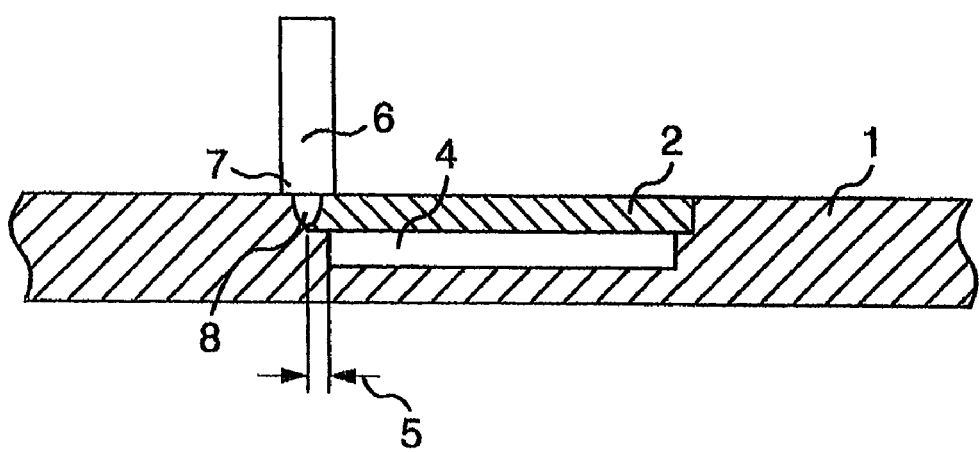
FIG. 2 is a cross section of the backing plate according to the present invention shown in FIG. 1.

FIG. 2 is a sectional view near a channel of a backing plate. A first groove that becomes the channel 4 whose cross section is rectangular is provided inside the body 1 by machining, a second groove that has a cross-sectional space larger than the channel 4 and has a step is formed on the first groove, and the lid 2 is fit in a part of the second groove. At this time, the body 1 and lid 2 have socket and spigot structure, and overlapping width 5 is about 2.5 mm. In addition, the width and height of the channel 4 are about 50 mm and 5 mm respectively, and further, the height of the lid 2 is 5 mm. Hence, when the lid 2 is fit into the body 1, both become the same height. Since these shapes or dimensions change according to types of backing plates, a planar shape of the body 1 also has a round shape besides a square shape in this way. Therefore, a penetration bead of a joining does not go into the channel 4, and hence, normal joining is obtained. Since a warp arose in the joining side of this backing plate after joining, the warp was corrected by press formation with a punch having an I-shaped edge, and thereafter, cutting and grinding were performed.

Next, an embodiment of the friction stir welding will be described. In the friction stir welding, the rotation tool 6 composed of a shoulder section 7 and a pin section 8 is inserted in joining material with being rotated. Then, the rotation tool 6 is moved along a joining line to perform joining. In this embodiment, the diameter of the shoulder section 7 was 15 mm, the maximum diameter of the pin section 8 was 8 mm, and the rotary direction of the rotation tool 6 was made to be counterclockwise. In addition, in the case that the rotation tool 6 inclines at three degrees in the direction opposite to the traveling direction, and the case that the rotation tool 6 does not inclines, an experiment of the former and the latter was performed under the conditions of a rotation speed of 1300 rpm or 1500 rpm, a joining speed of 270 mm/min or 300 mm/min, and a shift of a centerline of the rotation tool 6 by 3.0 mm or 1.5 mm from a joining beveling in a direction opposite to the channel 4 (offset 3.0 mm or 1.5 mm).

Figure 3:
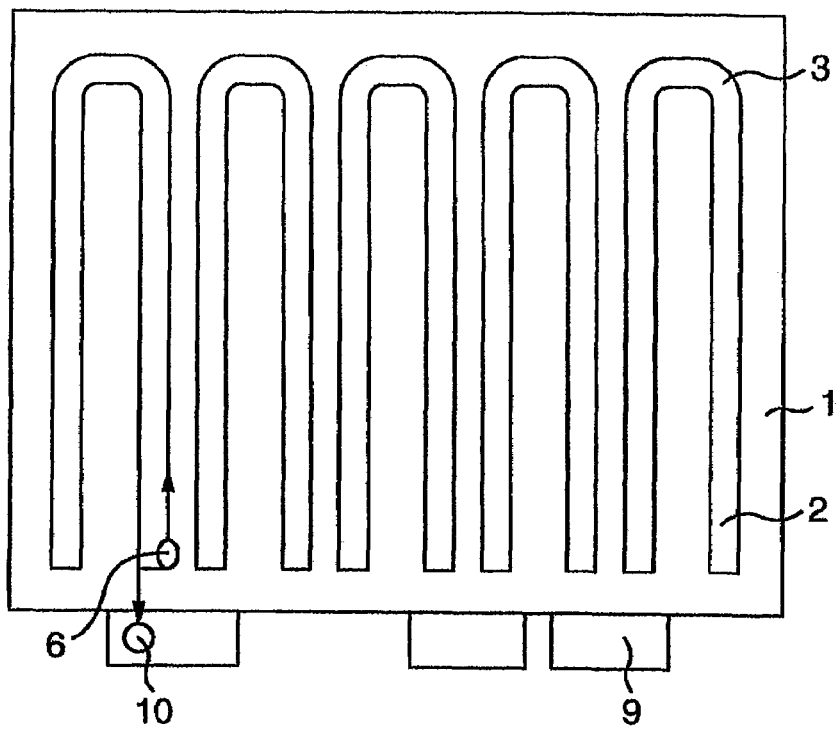
FIG. 3 is a plan showing movement of the rotation tool according to the present invention shown in FIG. 1.

That is, as shown in FIG. 3, joining was performed by traveling the rotation tool 6 along the joining line so that the channel might always be located in the left-hand side. In addition, since a hole 10 is made at a joining end in the case of the friction stir welding, dummies 9 were provided to let them be end sections. All the dummies 9 were cut after joining of the lid and body. What is important here is the relation among the rotary direction of the rotation tool 6, the channel, and the traveling direction of the rotation tool 6, and hence, it is also satisfactory to reverse all the left for all the right, and vice versa.

Figure 4:
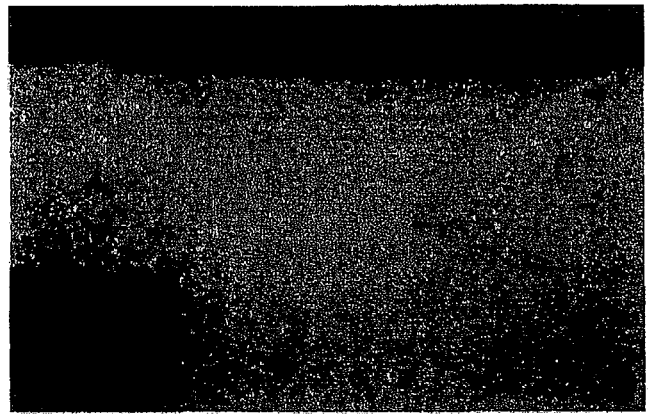
FIG. 4 is a microphotography of a cross section after the friction stir welding according to the present invention.

FIG. 4 shows a microphotography of a cross section of a weld bead. Although a weld bead does not have a defect, a joining becomes a little low in comparison with other parts since the rotation tool 6 is inserted a little in a joined material. However, as described above, a surface of a backing plate needs to be smooth, and hence, anyway, such a concavity is satisfactory because of performing the machining of the surface. In addition, although a part that is equivalent to a concavity of the weld bead that is released to the outside becomes a burr, this is satisfactory because of the same reason. However, the amount of machining at that time was an amount to be machined in the time that was ¼ or less in comparison with a conventional welding method. This is because a cutting step for correcting a bent after joining and smoothing a surface was shortened sharply since the heat distortion of the joining by the friction stir welding method is small, that is, 1/10 of that in the case of electron beam welding. In addition, it is clear that normal joining is obtained without spilling out the weld bead at the time of joining into the channel 4 since the weld bead are formed in the outside of the lower left channel 4 as shown in FIG. 4. The joining is performed so that a concavity may be made by pressing the shoulder 7. Moreover, each of the start and stop of the rotation tool was performed in a position apart from the joining.

TABLE 1

| Junction method | Number of tests (value) | Fraction defective (%) |
|---|---|---|
| Friction stir welding | 126 | 0 |
| Electron beam welding | 60 | 5 |

Table 1 shows the result of helium leakage test of the channel 4 by this method. The leakage test is performed at $1 \times 10^{-7}$ Pa, and a material for a current method, that is, an electron beam welding material was used as a comparison material. Although, in the case of the friction stir welding material, the fraction defectives were 0% in the case that the rotation tool 6 inclines at 2 degrees and the case that it does not incline and all are accepted, but the fraction defective was high, that is, 5% in the case of the electron beam welding material. In this case, with considering repair cost because a leaking section must be repaired again, a cost merit of the friction stir welding is very large.

A target for sputtering can be made by any one of brazing, friction stir welding, and electron beam joining, and can be placed in the joining side of the lid 2 or its opposite side, but it is preferable to place the target in the joining side.

Embodiment 2

Figure 5:
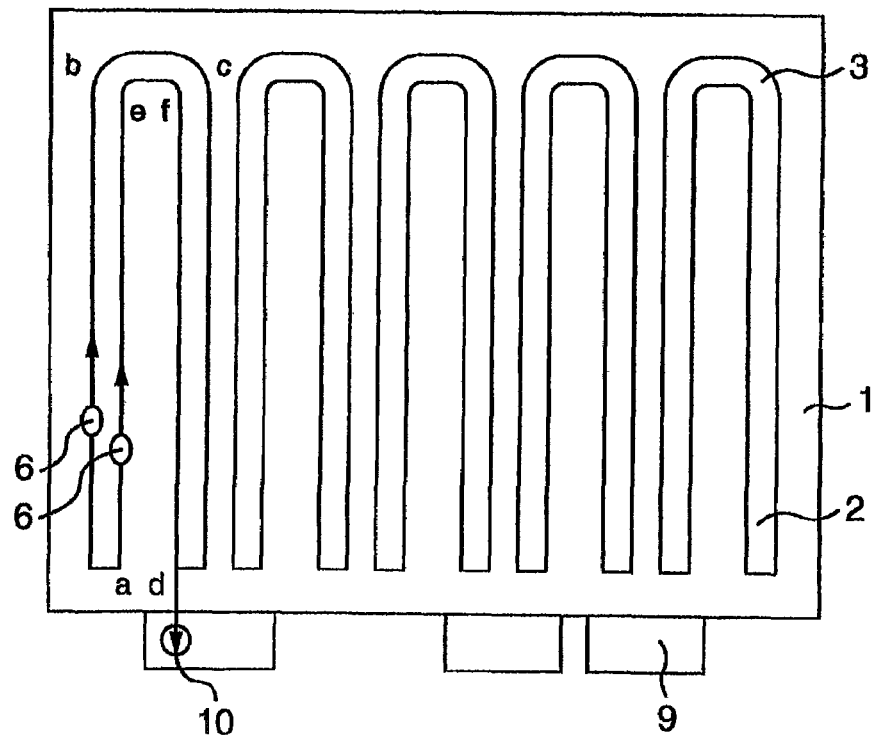
FIG. 5 is a plan showing the movement of a rotation tool according to the present invention.
Figure 6:
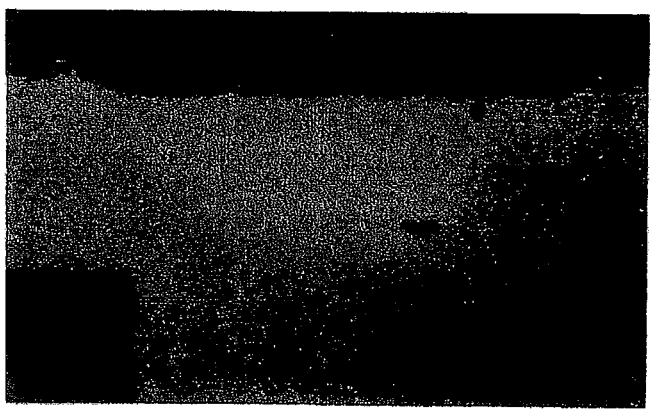
FIG. 6 is a microphotography of a cross section after friction stir welding according to the present invention.

This embodiment relates to the joining of the backing plate similar to that in FIG. 1, and in particular, a joining example about the R section 3 will be described. The rotation speed of a rotation tool, joining speed, and rotation tool geometry are the same as those in the first embodiment. As shown in FIG. 5, after first inserting the rotation tool 6 in a position "a", joining was performed in the path of a→b→c→d under the above-described conditions, and the end section 10 was made to be the dummy 9. Next, after inserting the rotation tool 6 in a position "a" again, joining was performed in the path of a→e→f→d, and the end section 10 was similarly treated. What is important at this time is that the rotation tool 6 always turns to the right in the R section 3. When the rotary direction of the rotation tool is clockwise contrary to this, what is necessary is just to perform joining so that the rotation tool may always turn to the left. Although a defect did not arise in a joining in any cases, a minute defect as shown in FIG. 6 may arise in the R section if the rotary direction and the turning direction of the rotation tool become contrary to the above in rare cases. However, since a defect having this level of size does not harmfully affect on leak-proof property, this is satisfactory. In addition, in this embodiment, the other structure and joining methods are the same as those of the above-described ones.

As for the joining, in this embodiment, although the R section 3 is present, it is possible to form the section by straight lines. Moreover, a weld bead was formed in the outside of the lower left channel 4 as shown in FIG. 6 without the weld bead spilling out to the channel 4, and furthermore, its penetration bead exists in the body. Hence, it is apparent that normal joining can be obtained.

Embodiment 3

What are examined in this embodiment are the overlapping width 5 shown in FIG. 2, and the distance (offset) apart from a joining beveling of the centerline of the rotation tool 6 in a direction opposite to the channel 4. The geometry of the rotation tool that is used is the same as that in the first and second embodiments. In addition, joining conditions are the same.

TABLE 2

| Overlapping Width w (mm) | Offset x (mm) | W + x (mm) | Maximum radius of pin r (mm) | State of joining |
| --- | --- | --- | --- | --- |
| 2.5 | 0 | 2.5 | 4.0 | Collapse |
| 2.5 | 1 | 3.5 | 4.0 | Collapse |
| 2.5 | 1.5 | 4.0 | 4.0 | Good |
| 1 | 0 | 1.0 | 4.0 | Collapse |
| 2 | 0 | 2.0 | 4.0 | Collapse |
| 3 | 0 | 3.0 | 4.0 | Collapse |
| 4 | 0 | 4.0 | 4.0 | Good | shown in Table 2, in order to obtain normal joining, it is preferable that $w+x \leq r$. That is, it is required for that the weld bead that is formed is in the outside of the channel. Moreover, a reason why the sample was not successful in joining is that the lid was collapsed due to the load received from the rotation tool.

Embodiment 4

Figure 7:
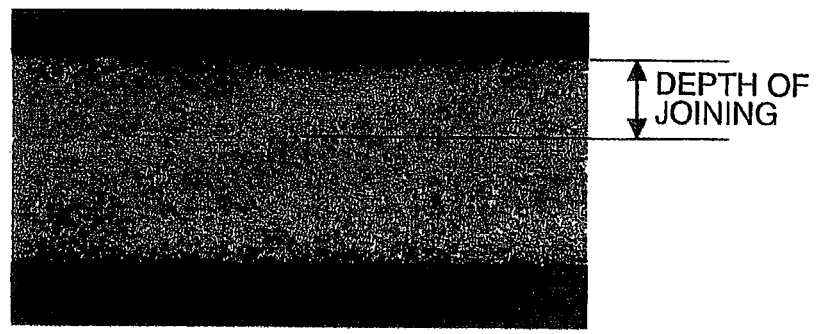
FIG. 7 is a microphotography of a cross section after friction stir welding according to the present invention.

In this embodiment, the temporary attachment of the lid was examined. A microphotography of the cross section of the temporary attachment section is shown in FIG. 7. The temporary attachment was performed with using a rotation tool, which did not have a pin section and had a shoulder with 13 mm of diameter, at a rotation speed of the rotation tool of 1500 rpm at a rate of 12 temporary attachments per lid. As shown in FIG. 7, the temporary attachment section is joined at a depth of about 2 mm. Next, permanent joining was performed under the same conditions as those in the first embodiment. In consequence, the lid was firmly fixed by the temporary attachment and the permanent joining was performed with sufficient accuracy. Thus, it turns out that, in the friction stir welding, firm fixation of a joining material is important and temporary attachment can be surely and easily performed without using another method.

Embodiment 5

Figure 8:
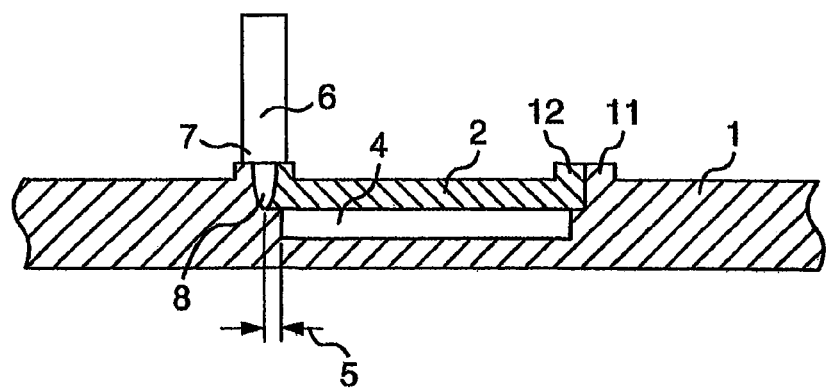
FIG. 8 is a sectional view in the case that joining is performed with providing a projection in a joining of a body and a lid according to the present invention.

This embodiment is the case that a projection with locally thick structure is present near a joining of a body and a lid. FIG. 8 shows an expanded sectional view of the vicinity of the joining according to the embodiment. It is the characteristic that the above-described thickness of the body and lid 2 is locally thick, and other dimensions etc. are not changed from those in the first embodiment. Here, it is desirable that the width of the thick convexities 11 and 12 is almost equivalent to or a little larger than the diameter of the shoulder 7 of the above-described rotation tool 6. In addition, it is desirable that the thick convexities 11 and 12 are higher than other parts by 0.3 to 2 mm. After joining, the joining height does not become low like that in the first embodiment, and hence, it is possible to simplify a subsequent surface cutting step. In addition, in this embodiment, the other structure and joining methods were the same as those in the above.

Embodiment 6

Figure 9:
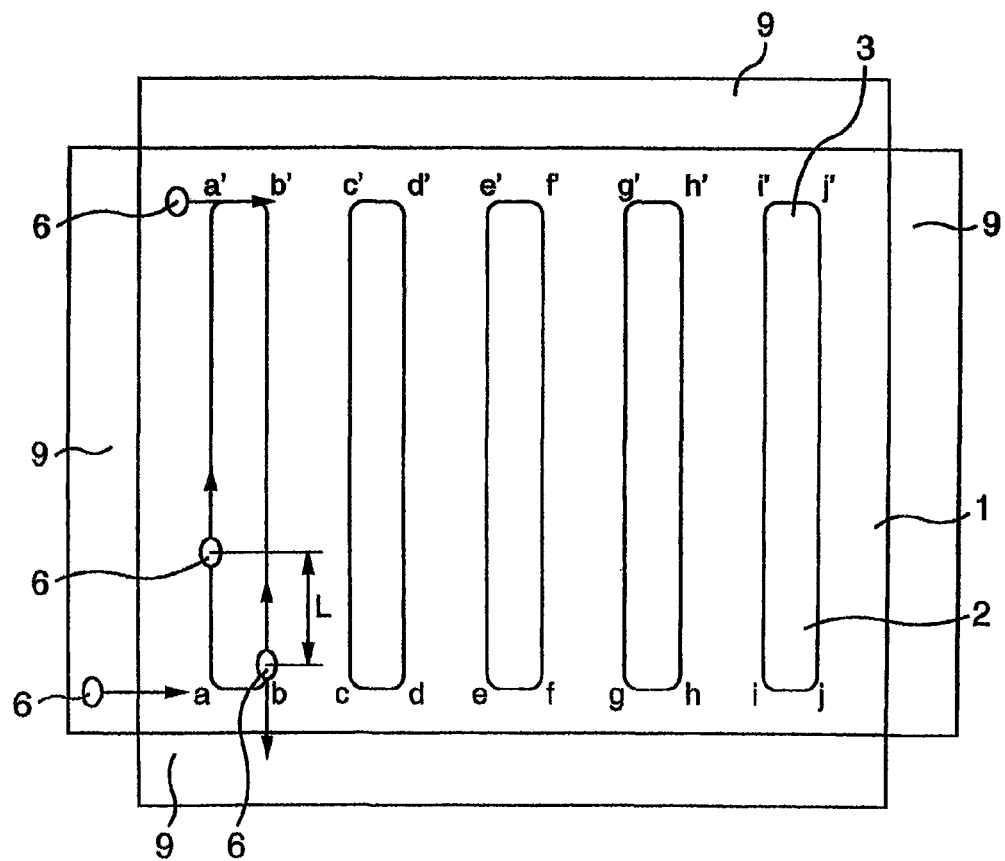
FIG. 9 is a plan of a backing plate according to the present invention.
Figure 10:
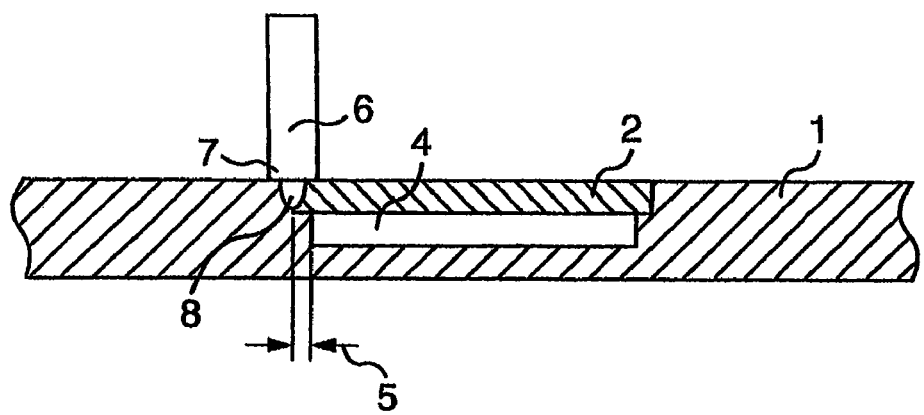
FIG. 10 is a sectional view of the backing plate according to the present invention shown in FIG. 9.

FIG. 9 is a plan of a backing plate where a channel has I-shaped structure. In addition, FIG. 10 is a sectional view of the vicinity of the channel. The body 1 and a lid 2 are made of oxygen free copper. The dimensions of the body 1 were 1200 L×900 W×15 D mm, and dimensions of five channels 4 are 40 W×5 H mm respectively. Moreover, in the R section 3, R=3 mm and overlapping width 5 is 5 mm. In addition, joining conditions, i.e., rotation tool geometry, rotation speed, and joining speed are the same as those in the first embodiment, and an offset is made to be zero. In addition, the rotation tool 6 is inclined at 2 degrees in the direction opposite to the traveling direction. In addition, in this embodiment, the other structure and joining methods are the same as those of the above-described ones.

In this embodiment, in order to make the above-described channel 4 airtight, the joining of the lid 2 was joined with using two rotation tools 6. First, the lid 2 is temporarily attached to the body 1 with the rotation tools constituted only by a shoulder respectively. Next, the lid 2 and body 1 were joined along joining lines a-a' and b-b' with using the two rotation tools 6. Since the distance of joining lines a-a' and b-b' is narrow, that is, about 50 mm, the two rotation tools 6 keep a gap (L) so that they may not interfere mutually. At this time, L is about 200 mm. Next, joining was performed along the joining lines c-c', d-d', e-e', and f-f'one by one. Next, joining was performed along the joining lines a-j and a'-j' simultaneously. At this time, R=3 mm in the R section 3, and the diameter of the pin was 8 mm, and the R section 3 was joined along two joining lines that were orthogonal to each other. Hence, it becomes possible to perform the above-described joining only in linear joining, and therefore, it becomes possible to simplify the structure of the above-described joining apparatus and to reduce the cost of the apparatus. In addition, also in this embodiment, dummies 9 were used for all of starting points and ending points of joining, and the dummies 9 were cut after the completion of joining.

By the way, in this embodiment, since two rotation tools were used for simultaneously performing joining, the frictional heat generated in the rotation tools and joining was large. For this reason, joining was tried with flowing cooling water in the vicinity of a joining, the whole backing plate and the channel. Although joining conditions were almost equivalent to the case where no cooling water was supplied, the rotation speed of rotation tools was set to 2000 rpm owing to this, the surface temperature of a part of the body 1 which was separated from a joining by about 4 mm was 100° C. or less, which was a half of heat distortion after joining in the case of no water-cooling. Hence, correction of distortion after joining becomes unnecessary. In addition, since the temperature of a joining was about 700° C., water was boiled at the part, but there was no penetration of moisture into the joining, and hence, there was neither generation of a defect nor deterioration of mechanical characteristics.

Embodiment 7

Figure 11:
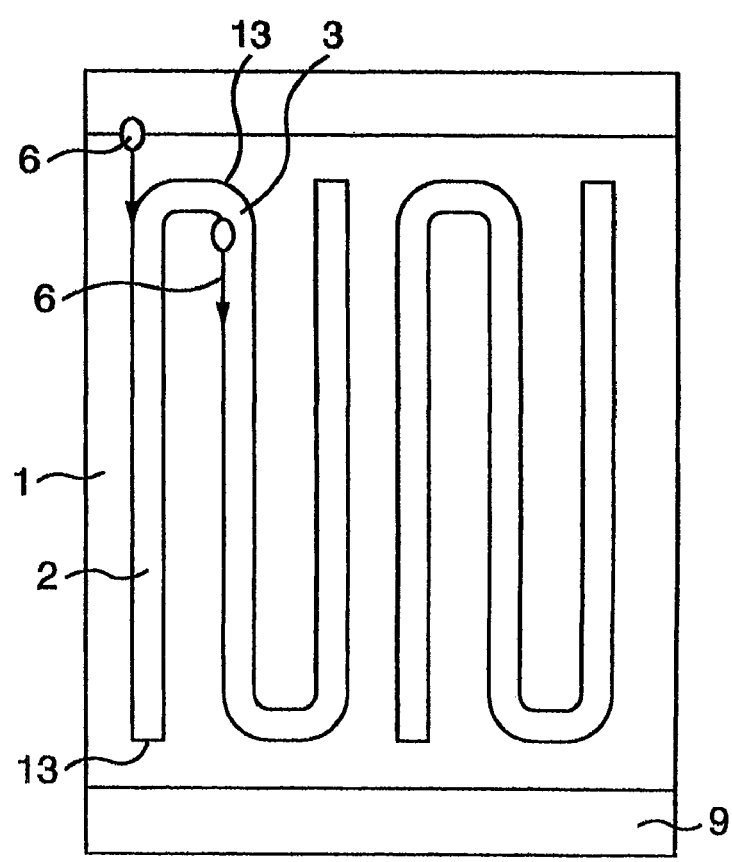
FIG. 11 is a plan of a backing plate according to the present invention.

FIG. 11 is a plan of a backing plate that has reverse S-shaped channels 4. The body 1 and a lid 2 are made of oxygen free copper. Although the planar shapes of the channel 4 and lid 2 are the same, dimensions differ a little. The lid 2 is integrated. The dimensions of the body 1 are 1200 L×900 W×15 D mm, and dimensions of two or four channels 4 are 40 W×5 H mm respectively. Moreover, in the R section 3, R=15 mm and overlapping width 5 is 5 mm. In addition, joining conditions, i.e., rotation tool geometry, rotation speed, and joining speed were the same as those in the first embodiment, and an offset was made to be zero. In addition, the rotation tool 6 was inclined at 2 degrees in the direction opposite to the traveling direction. In this embodiment, TIG welding was used for temporarily joining the R section. First, the lid 2 was fit in the body 1, and a section (TIG section) shown by thick lines in FIG. 11 was joined by the TIG welding. Next, the friction stir welding of a joining to be joined was performed with using the rotation tool 6. At this time, since a locus of the rotation tool became only in the vertical direction, for example, on this paper, a joining apparatus became an apparatus that was simplified by having control only in the vertical direction on this paper. Hence, it is possible to achieve cost reduction of a facility.

Embodiment 8

Figure 12:
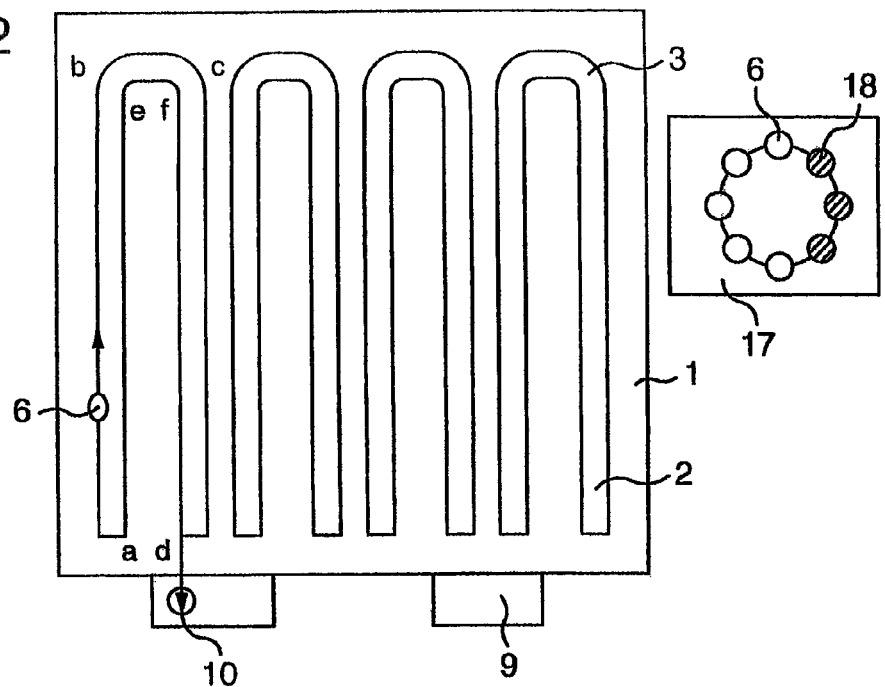
FIG. 12 is a plan of a backing plate according to the present invention.
Figure 13:
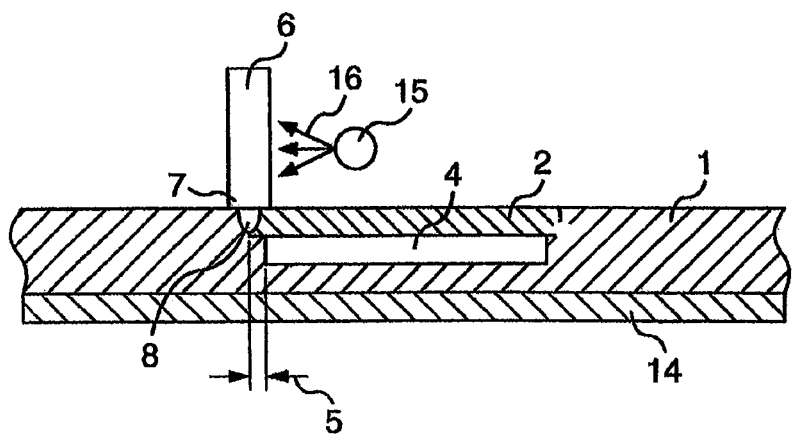
FIG. 13 is a sectional view of the backing plate according to the present invention shown in FIG. 12.

FIG. 12 is a schematic diagram of a backing plate. The body 1 and a lid 2 are made of oxygen free copper. In addition, FIG. 13 is a sectional view of the vicinity of the joining of FIG. 12. Geometry, joining conditions, etc. of the body 1 are the same as those in the seventh embodiment. Moreover, the lid 2 has an air vent in an end section, and is integrated in a U-shape. In this embodiment, life extension of the rotation tool 6 was examined. The body 1 was fixed on the heat sink 14 that had a channel through which a coolant circulated inside. In addition, there was a cooling system 15, which cooled the rotation tool 6, near the rotation tool 6, and which sprayed a cooling gas 16 on the rotation tool 6. It turns out that the surface temperature of the rotation tool 6 increases to about 400° C. during joining. If the motor or spindle rotating the rotation tool 6 is exposed to such high temperature, it will malfunction. When a motor with 5 kW of output was used, the temperature of the spindle rose due to heat transfer from the rotation tool 6, and when there was no cooling system 15, a safety device was often activated to stop the motor.

An inert gas besides air is also sufficient as the cooling gas 16, and a flow rate was 10 L/min. Since the surface temperature of the rotation tool 6 became about 150° C. by using the cooling system 15, it became possible to prevent the damage of the rotation tool 6. In addition, if moisture etc. remains in the channel 4 after manufacturing in regard to a backing plate, there is a possibility of surface contamination arising because the moisture adheres to a surface used as a product at the time of subsequent conveyance etc. Hence, there is a case that underwater friction stir welding is not suitable. In this case, another heat sink 14 different from this was used as a method for distortion reduction. Since the 20° C. coolant always circulated in the heat sink 14, it was possible to lessen heat distortion by the friction stir welding similarly to that by the underwater friction stir welding. In addition, all joining was performed by NC control in this embodiment. Junction was performed with using one rotation tool per channel.

The procedure of joining of a left lid in FIG. 12 is as follows. The rotation tool was first moved in order of d→f→e→a→b→c→d under the above-described joining conditions after inserting the rotation tool 6 in a dummy 9, and the end section 10 was set on the dummy 9. The tracing of these rotation tools 6 was performed by using an NC controller not shown. Next, the rotation tool was exchanged to a rotation tool 6 reserved in a tool magazine 17. Then, the following lid was joined. Since a rotation tool is cooled within the rotation tool magazine 17 by exchanging a rotation tool every lid and performing joining, the load of the rotation tool is reduced. In a phase of the completion of joining of all lids, next, the rotation tool was exchanged to a tool 18 for cutting in the tool magazine 17, and the processed face of the backing plate was smoothed. Such a series of processes was fully automated by programming a sequence.

A conventional manufacturing method has complicated steps as follows:

(1) Washing of a backing plate (because it is necessary to remove contamination in order to perform joining in vacuum in subsequent electron beam welding), (2) Fixation of a backing plate to a jig for electron beam welding, (3) Vacuum pumping, (4) Electron beam welding, (5) Vacuum leakage test and removal from the jig, (6) Heat treatment for removal of heat distortion, and (7) Smoothing by cutting.

According to a method like the present invention, it is possible to perform a series of processes like these only by one apparatus by exchanging a tool, and it is also unnecessary to perform heat treatment for removal of heat distortion. Hence, it is possible to understand that welding is a machining process that is a direct extension of machining, productivity is high, and sharp reduction of manufacturing cost can be achieved.

Embodiment 9

Figure 14:
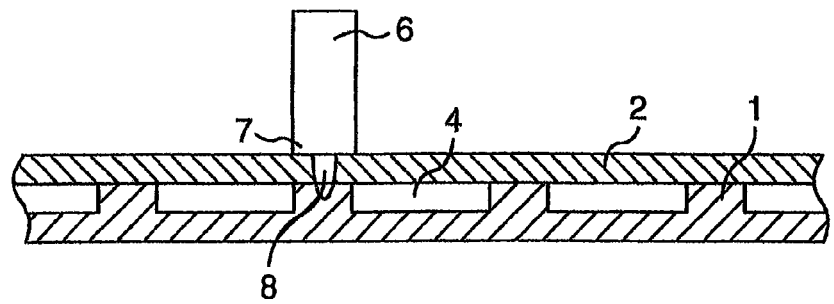
FIG. 14 is a sectional view of a backing plate according to the present invention.

FIG. 14 is a sectional view of a lid and a backing plate, the lid whose geometry is the same as that of a backing plate. The body 1 and a lid 2 are made of oxygen free copper. The thickness of the body 1 is 10 mm, and the channel 4 is at a width of 30 mm, a height of 5 mm, and a space of 15 mm. In addition, the lid 2 covers all the channels that are more than one, and joining is performed by lap joint of the lid 2 and the body 1. The geometry of the channel is the same as that in the above-described embodiments, and the channel having a closed path is used. Therefore, one air vent is provided in an edge of each channel. As for the geometry of the rotation tool, a diameter of the shoulder section 7 is 14 mm, and the maximum diameter of the pin section 8 is 8 mm and length is 7 mm. Rotation speed and joining speed were the same as those in the first embodiment, and a middle section of adjacent channels was joined. In addition, the rotation tool 6 was inclined at 2 degrees in the direction opposite to the traveling direction.

In this embodiment, although a joining form was not butt joint but was lap joint, no defect was generated in joining parts, and heat deformation at the time of joining was also small, and hence this was manufacturable. Thus, a backing plate can be manufactured according to this process regardless of joint geometry. In this embodiment, the perimeter of the backing plate and all the spaces between channels were joined according to the planar surface geometry of the channels. Junction using a dummy can be performed similarly. The press forming, grinding, and polishing after joining as well as the above described can be performed.

Embodiment 10

Figure 15:
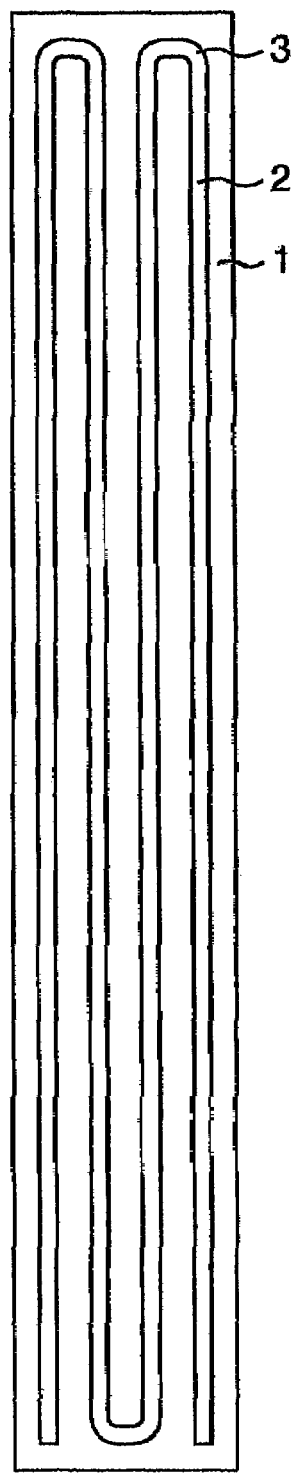
FIG. 15 is a plan of a backing plate according to the present invention.

FIG. 15 is a plan at the time of the channel 4 being formed in an oblong M-shape in the long backing plate. The body 1 and a lid 2 are made of oxygen free copper. The dimensions of the body 1 are 2000 L×300 W×15 D mm, and the channel 4 is at a width of 30 mm, a height of 5 mm, and a space of 15 mm. In addition, the lid 2 has the same planar surface geometry as the channel, length and width of the lid 2 are formed a little largely than those of the channel 4, and a cross section thereof is the same as that of the first embodiment. The joining of the lid 2 and the body 1 is butt joint. The geometry of the channel is the same as that in the above-described embodiments, and the channel having a closed path is used. Moreover, one air vent is provided in an edge of a channel. As for the geometry of the rotation tool, a diameter of the shoulder section 7 is 14 mm, and the maximum diameter of the pin section 8 is 8 mm and length is 7 mm. Rotation speed and joining speed were the same as those in the first embodiment, and a middle section of adjacent channels was joined. In addition, the rotation tool 6 was inclined at 2 degrees in the direction opposite to the traveling direction.

In this embodiment, a joining form was the same as the butt joint in the above described, no defect was generated in joining parts, and heat deformation at the time of joining was also small, and hence this was manufacturable. An end section of a weld bead was provided except the joining. In addition, joining using a dummy can be performed similarly as described above. The press forming, grinding, and polishing after joining as well as the above described can be performed.

According to the present invention, it is possible to obtain a cooling plate that has normal joining by friction stir welding. In consequence, it is possible to obtain a backing plate having high cooling effectiveness, small heat distortion, a thin shape, large-area geometry, and good quality.

The invention claimed is:

1. A manufacturing method of a cooling plate comprising a body and a lid, said body having a groove, which becomes a passage of a coolant, comprising joining the lid and the body along at least one abutting line of the lid and the body so as to cover the groove by the lid by friction stir welding owing to insertion of a rotation tool which has a shoulder and a pin, and making the groove be a left-hand side to a traveling direction of joining and the abutting line when the rotation tool rotates to the left, and a right-hand side to a traveling direction of joining and the abutting line when the rotation tool rotates to the right.

2. A manufacturing method of a cooling plate comprising a body made of copper or copper alloy and a lid made of copper or copper alloy, said body having a groove, which becomes a passage of a coolant, comprising joining the lid and the body so as to cover the groove by the lid by friction stir welding owing to insertion of a rotation tool which has a shoulder and a pin, and setting a center of the rotation tool in a position which is apart from an edge of the groove by a radius of the pin or more as well as the rotation tool outside the passage.

3. A manufacturing method of a cooling plate comprising a body and a lid, said body having a groove, which becomes a passage of a coolant and is terminated inside the body, comprising joining the lid to the body so as to entirely cover the groove by the lid by friction stir welding, and providing an air vent in a portion of the lid forming the passage.

4. The manufacturing method of a cooling plate according to claim 3, wherein, after the lid and the body are partially and temporarily joined by friction stir welding owing to insertion of a rotation tool which has only a shoulder beforehand, a whole joining is joined by friction stir welding.

5. A manufacturing method of a cooling plate comprising a body and a lid, said body having a groove, which becomes a passage of a coolant, comprising joining the lid to the body so as to cover the groove by the lid by friction stir welding owing to insertion of a rotation tool which has a shoulder and a pin, and extending an end portion of a weld bead outside a joined portion of the lid and the body.

6. The manufacturing method of a cooling plate according to claim 5, wherein, after the lid and the body are partially and temporarily joined by friction stir welding owing to insertion of a rotation tool which has only a shoulder beforehand, a whole joining is joined by friction stir welding.

7. A manufacturing method of a cooling plate comprising a body and a lid, said body having a first groove, which becomes a passage of a coolant, and a second groove, which has width larger than the first groove and receives the lid so as to cover the first groove, comprising joining the lid and the body together by friction stir welding owing to insertion of a rotation tool having a shoulder and a pin so that a weld bead formed by the joining may become outside the passage, wherein, after the lid and the body are partially and temporarily joined by friction stir welding owing to insertion of a rotation tool which has only a shoulder beforehand, a whole joining is joined by friction stir welding.

8. The manufacturing method of a cooling plate according to claim 1, wherein, after the lid and the body are partially and temporarily joined by friction stir welding owing to insertion of a rotation tool which has only a shoulder beforehand, a whole joining is joined by friction stir welding.

9. The manufacturing method of a cooling plate according to claim 2, wherein, after the lid and the body are partially and temporarily joined by friction stir welding owing to insertion of a rotation tool which has only a shoulder beforehand, a whole joining is joined by friction stir welding.

* * * * *

UNITED STATES PATENT AND TRADEMARK OFFICE
CERTIFICATE OF CORRECTION

| | | |
|---|---|---|
| PATENT NO. | : 7,480,992 B2 | Page 1 of 1 |
| APPLICATION NO. | : 11/693431 | |
| DATED | : January 27, 2009 | |
| INVENTOR(S) | : Okamoto et al. | |

It is certified that error appears in the above-identified patent and that said Letters Patent is hereby corrected as shown below:

On the title page, Item should read:

(73)   Assignee: Hitachi Cable, Ltd., Tokyo (JP)

Signed and Sealed this

Fourteenth Day of April, 2009

JOHN DOLL
*Acting Director of the United States Patent and Trademark Office*